US012080336B2

(12) United States Patent
Li et al.

(10) Patent No.: US 12,080,336 B2
(45) Date of Patent: Sep. 3, 2024

(54) APPARATUSES AND METHODS FOR COMPENSATED SENSE AMPLIFIER WITH CROSS COUPLED N-TYPE TRANSISTORS

(71) Applicant: MICRON TECHNOLOGY, INC., Boise, ID (US)

(72) Inventors: Jiyun Li, Boise, ID (US); Christopher J. Kawamura, Boise, ID (US); Tae H. Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 40 days.

(21) Appl. No.: 17/662,198

(22) Filed: May 5, 2022

(65) Prior Publication Data

US 2023/0360690 A1 Nov. 9, 2023

(51) Int. Cl.
*G11C 11/4091* (2006.01)
*H03F 3/45* (2006.01)

(52) U.S. Cl.
CPC ...... *G11C 11/4091* (2013.01); *H03F 3/45264* (2013.01)

(58) Field of Classification Search
CPC ..... G11C 11/4091; G11C 5/025; G11C 7/065; G11C 11/4094; H03F 3/45264
USPC ....................................................... 365/207
See application file for complete search history.

(56) References Cited

U.S. PATENT DOCUMENTS

| | | | |
|---|---|---|---|
| 4,982,363 A | 1/1991 | Sood | |
| 5,469,393 A | 11/1995 | Thomann | |
| 7,894,286 B2 | 2/2011 | Jung et al. | |
| 9,431,094 B1 | 8/2016 | Takai | |
| 10,839,873 B1 | 11/2020 | Lee | |
| 11,152,055 B1 | 10/2021 | Lee | |
| 2001/0028593 A1 | 10/2001 | Sekiguchi et al. | |
| 2002/0000860 A1 | 1/2002 | Dai | |
| 2002/0101771 A1 | 8/2002 | Lee et al. | |
| 2002/0118576 A1 | 8/2002 | Ohba et al. | |
| 2011/0002152 A1 | 1/2011 | Lane et al. | |
| 2011/0304358 A1* | 12/2011 | Thompson | G11C 7/06 327/52 |

(Continued)

OTHER PUBLICATIONS

U.S. Appl. No. 17/447,490 titled "Apparatuses and Methods for Single-Ended Sense Amplifiers" filed Sep. 13, 2021, all pages of application as filed.

(Continued)

*Primary Examiner* — Huan Hoang
(74) *Attorney, Agent, or Firm* — Dorsey & Whitney LLP

(57) ABSTRACT

Apparatuses, systems, and methods for compensated sense amplifier with cross-coupled n-type transistors. A sense amplifier has a pair of p-type transistors coupled between a system voltage and respective first and second gut nodes. When a command signal is active, the p-type transistors are coupled in a diode fashion from the system voltage to the respective gut nodes. The amplifier also has a pair of n-type transistors which are cross coupled, where a first n-type transistor has a node coupled to the first gut node and a gate coupled to the second gut node and the second n-type transistor has a node coupled to the second gut node and a gate coupled to the first gut node. Each of the n-type transistors may have a separate current flowing through them and respective one of a pair of feedback transistors to a ground voltage.

21 Claims, 5 Drawing Sheets

(56) References Cited

U.S. PATENT DOCUMENTS

| | | |
|---|---|---|
| 2014/0119093 A1 | 5/2014 | Singh et al. |
| 2018/0357007 A1 | 12/2018 | Zawodny et al. |
| 2019/0392877 A1 | 12/2019 | Kawamura |
| 2020/0075082 A1 | 3/2020 | Derner |
| 2022/0020421 A1 | 1/2022 | Kadowaki |
| 2022/0028446 A1* | 1/2022 | Peng .................. G11C 5/06 |

OTHER PUBLICATIONS

U.S. Appl. No. 16/934,909 titled "Apparatuses Including Threshold Voltage Compensated Sense Amplifiers and Methods for Compensating Same" filed Jul. 21, 2020, pp. all pages of application as filed.

\* cited by examiner

APPARATUSES AND METHODS FOR COMPENSATED SENSE AMPLIFIER WITH CROSS COUPLED N-TYPE TRANSISTORS

BACKGROUND

This disclosure relates generally to semiconductor devices, and more specifically to semiconductor memory devices. In particular, the disclosure relates to volatile memory, such as dynamic random access memory (DRAM). Information may be stored on individual memory cells of the memory as a physical signal (e.g., a charge on a capacitive element). When accessed, the memory cell may be coupled to a digit line (or bit line), which in turn may be coupled to a sense amplifier. Along with the digit line coupled to the memory cell, a second, complimentary digit line may also be coupled to the sense amplifier.

The performance of the sense amplifiers in a memory may be a major factor in determining the characteristics of the memory, such as speed, reliability, power consumption, etc. Accordingly, there may be a need to optimize the performance of sense amplifiers.

DETAILED DESCRIPTION

Figure 1:
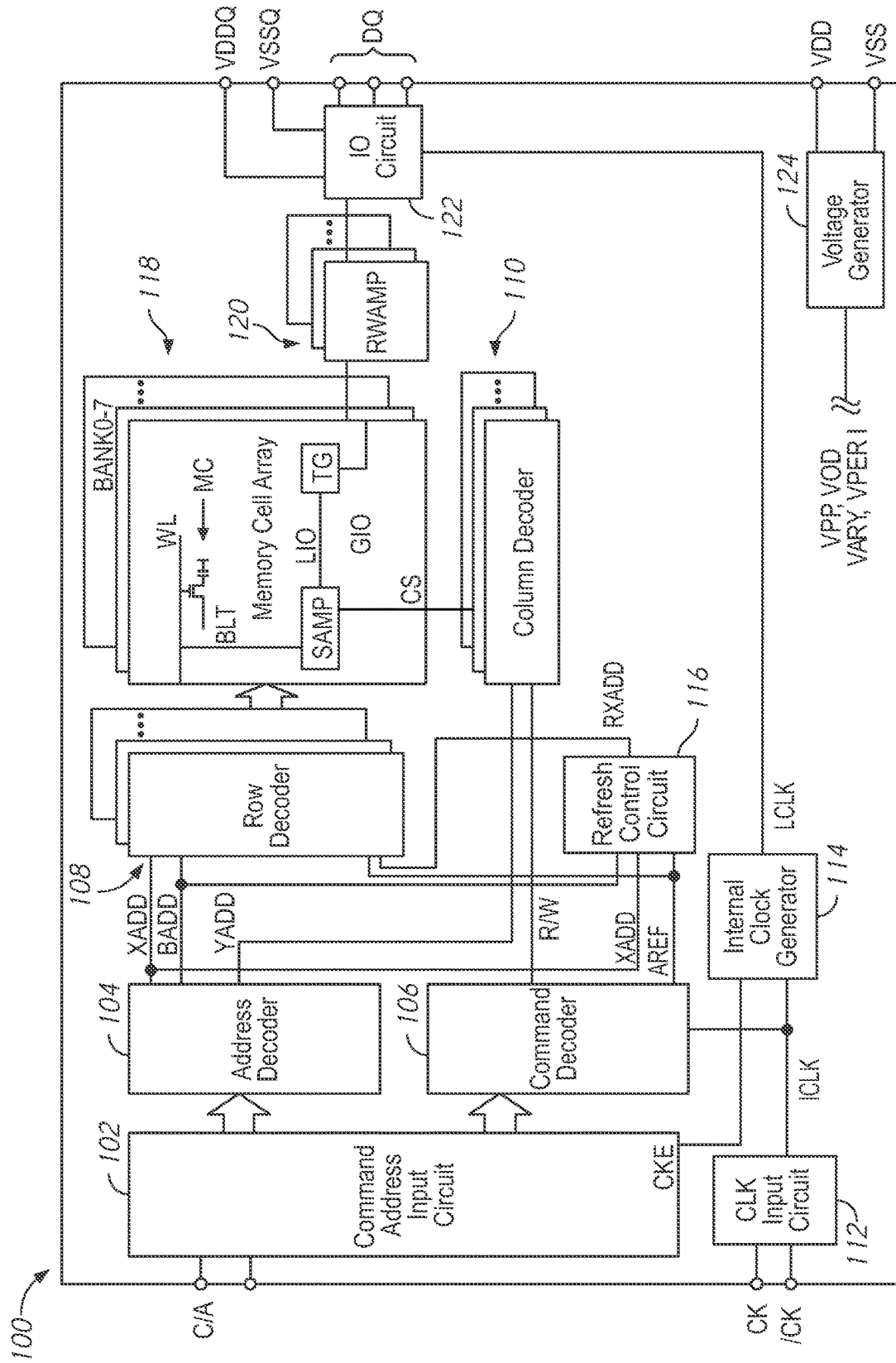
FIG. 1 is a block diagram of a semiconductor device according an embodiment of the disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Memory devices may include a memory array which includes a number of memory cells, each of which may store information. For example, each memory cell may store a single bit of information. The memory cells may be located at the intersections of word lines (rows) and digit lines (bit lines/columns). Each word line may be associated with a row address, and each digit line may be associated with a column address. Accordingly, memory cells may be specified by their row and column addresses. When a memory cell is accessed (e.g., a read or write operation), the memory cell may be coupled via the bit line to a sense amplifier. For example in a read operation, the value stored in the memory cell (e.g., as a capacitive charge) may change a voltage of the bit line. The sense amplifier may detect this change, amplify the voltage along the bit line to a system level (e.g., a voltage which represents logical high or a voltage which represents logical low) and then provide those voltages along a local input/output line (LIO) and global input/output line (GIO) to read/write amplifiers, which in turn may send the voltage to data terminals of the memory. During an example write operation, the process may generally be reversed (e.g., from GIO to LIO, to sense amplifier to bit line to memory cell).

The sense amplifier may be coupled to a first digit line, which is coupled to the accessed memory cell, and a second digit line. The second digit line may be used as a reference. The use of complimentary digit lines may be useful for differentiating between different voltages (e.g., by comparing the complimentary values). Sense amplifiers may be coupled between a pair of adjacent word lines, with the two couple digit lines coupled to a respective memory cell of the two word lines. During operation, one word line may be activated to read out data from the activated memory cell along the first digit line, while the second digit line may act as a reference.

In a conventional memory device, the sense amplifiers may be compensated sense amplifiers. For example, during a compensation phase, the sense amplifiers may include a pair of p-type transistors which are cross-coupled together between a system voltage which represents a logical high (e.g., an activation signal ACT) and gut nodes of the sense amplifier. In other words, a first p-type transistor couples the system voltage to a first gut node based on a voltage on a first digit line and the second p-type transistor couples the system voltage to a second gut node based on a voltage on a second digit line. Similarly, a conventional memory device has a pair of n-type transistors which are coupled as diodes with a first n-type transistor which couples the first gut node to a ground voltage (e.g., VSS) based on a voltage along the first digit line and a second n-type transistor which couples the second gut node to the ground voltage based on the voltage along the second digit line. However, n-type transistors may generally be stronger than p-type transistors and there may be benefits to using the stronger transistors in a cross-couple fashion.

The present disclosure is drawn to apparatuses, systems, and methods for a compensated sense amplifier with cross-coupled n-type transistors. A sense amplifier of the present disclosure has a first pair of p-type transistors which are coupled in diode fashion and a second pair of n-type transistors which are cross-coupled. For example a first p-type transistor may couple the system voltage to the first gut node based on a voltage on a second digit line, and the second p-type transistor may couple the system voltage to the second gut node based on the voltage on a first digit line. The first n-type transistor may couple the first gut node to a ground voltage based on the voltage along the second gut node and the second n-type transistor may couple the second gut node to the ground voltage based on the voltage along the first gut node.

The cross-coupled n-type transistors may offer a strong response, which may lead to undesirable behavior (e.g., non-linear behavior) due to mismatches between the n-type transistors. To account for this, it may be useful to individually control a current through each of the two n-type transistors. For example, each n-type transistor may have an additional transistor coupled between the n-type transistor and the ground voltage. These transistors may be activated by a common control signal and may each act as a resistor between the n-type transistor and the ground voltage when active. This may act as a negative feedback system to help control current flow through each n-type transistor.

FIG. 1 is a block diagram of a semiconductor device according an embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. Each memory bank includes a plurality of word lines WL, a plurality of bit lines BLT, and a plurality of memory cells MC arranged at intersections of the plurality of word lines WL and the plurality of bit lines BLT. The selection of the word line WL is performed by a row decoder 108 and the selection of the bit lines BLT is performed by a column decoder 110. In the embodiment of FIG. 1, the row decoder 108 includes a respective row decoder for each memory bank and the column decoder 110 includes a respective column decoder for each memory bank. The bit lines BLT are coupled to a respective sense amplifier (SAMP). Read data from the bit line BLT is amplified by the sense amplifier SAMP, and transferred to read/write amplifiers 120 over local data lines (LIO), transfer gate (TG), and global data lines (GIO). Conversely, write data outputted from the read/write amplifiers 120 is transferred to the sense amplifier SAMP over the complementary main data lines GIO, the transfer gate TG, and the complementary local data lines LIO, and written in the memory cell MC coupled to the bit line BLT.

The semiconductor device 100 may employ a plurality of external terminals, such as solder pads, that include command and address (C/A) terminals coupled to a command and address bus to receive commands and addresses, clock terminals to receive clocks CK and /CK, data terminals DQ coupled to a data bus to provide data, and power supply terminals to receive power supply potentials VDD, VSS, VDDQ, and VSSQ.

The clock terminals are supplied with external clocks CK and /CK that are provided to an input circuit 112. The external clocks may be complementary. The input circuit 112 generates an internal clock ICLK based on the CK and /CK clocks. The ICLK clock is provided to the command decoder 106 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data. The input/output circuit 122 may include a number of interface connections, each of which may be couplable to one of the DQ pads (e.g., the solder pads which may act as external connections to the device 100).

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The column decoder 110 may provide a column select signal CS, which may activate a selected one of the sense amplifiers SAMP. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The device 100 may receive an access command which is a read command. When a read command is received, and a bank address, a row address and a column address are timely supplied with the read command, read data is read from memory cells in the memory array 118 corresponding to the row address and column address. The read command is received by the command decoder 106, which provides internal commands so that read data from the memory array 118 is provided to the read/write amplifiers 120. The read data is provided along the data bus and output to outside from the data terminals DQ via the input/output circuit 122.

The device 100 may receive an access command which is a write command. When the write command is received, and a bank address, a row address and a column address are timely supplied with the write command, write data supplied to the data terminals DQ is provided along the data bus and written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 to the read/write amplifiers 120, and by the read/write amplifiers 120 to the memory array 118 to be written into the memory cell MC.

The device 100 may also receive commands causing it to carry out one or more refresh operations as part of a self-refresh mode. In some embodiments, the self-refresh mode command may be externally issued to the memory device 100. In some embodiments, the self-refresh mode command may be periodically generated by a component of the device. In some embodiments, when an external signal indicates a self-refresh entry command, the refresh signal AREF may also be activated. The refresh signal AREF may be a pulse signal which is activated when the command decoder 106 receives a signal which indicates entry to the self-refresh mode. The refresh signal AREF may be activated once immediately after command input, and thereafter may be cyclically activated at desired internal timing. The refresh signal AREF may be used to control the timing of refresh operations during the self-refresh mode. Thus, refresh operations may continue automatically. A self-refresh exit command may cause the automatic activation of the refresh signal AREF to stop and return to an IDLE state.

The refresh signal AREF is supplied to the refresh control circuit 116. The refresh control circuit 116 supplies a refresh row address RXADD to the row decoder 108, which may refresh one or more wordlines WL indicated by the refresh row address RXADD. In some embodiments, the refresh address RXADD may represent a single wordline. In some embodiments, the refresh address RXADD may represent multiple wordlines, which may be refreshed sequentially or simultaneously by the row decoder 108. In some embodiments, the number of wordlines represented by the refresh address RXADD may vary from one refresh address to another. The refresh control circuit 116 may control a timing of the refresh operation, and may generate and provide the refresh address RXADD. The refresh control circuit 116 may be controlled to change details of the refreshing address RXADD (e.g., how the refresh address is calculated, the timing of the refresh addresses, the number of wordlines represented by the address), or may operate based on internal logic.

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPERI, and the like based on the power supply potentials VDD and VSS supplied to the power supply terminals.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
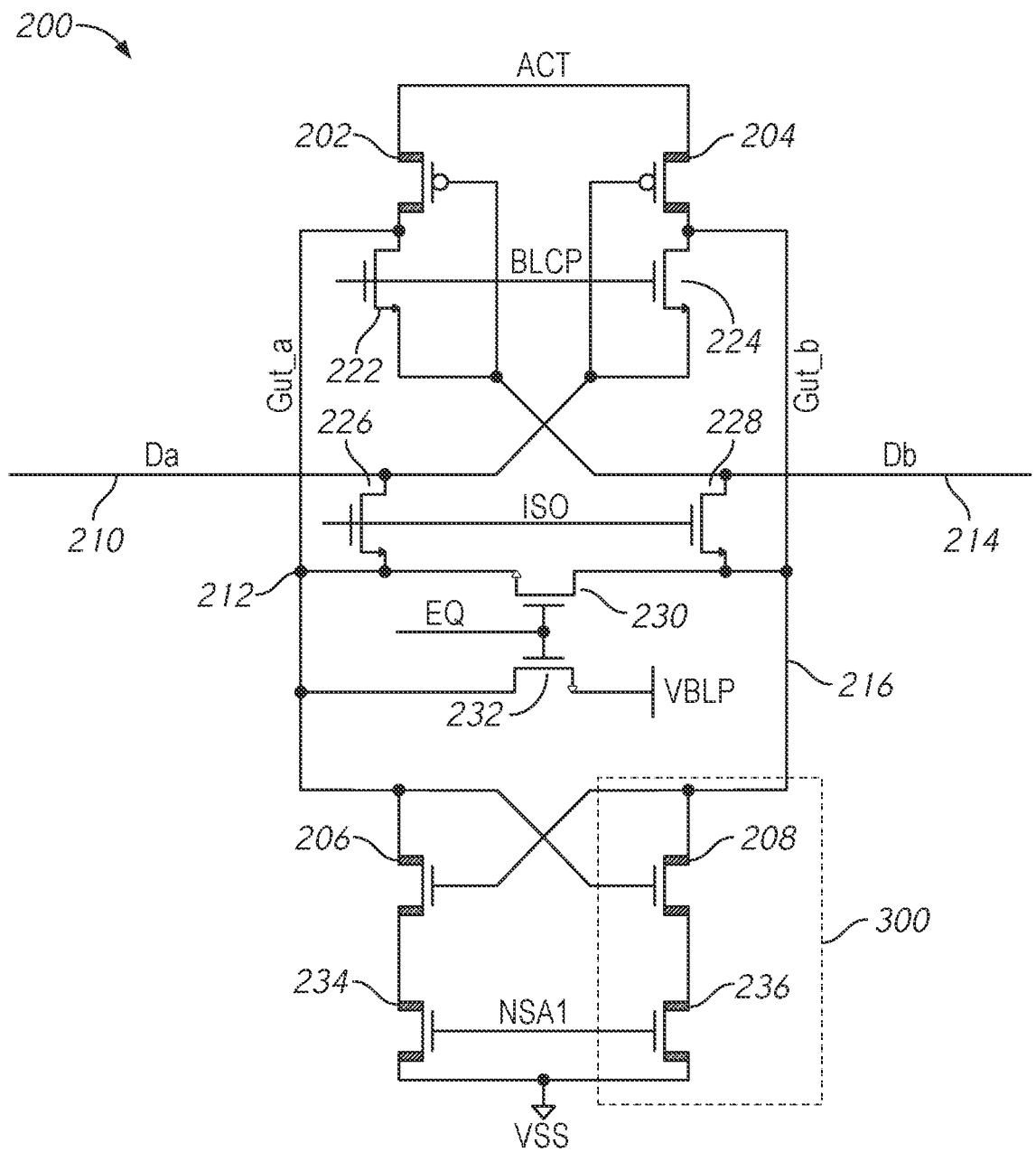
FIG. 2 is a schematic diagram of a sense amplifier according to some embodiments of the present disclosure.

FIG. 2 is a schematic diagram of a sense amplifier according to some embodiments of the present disclosure. The sense amplifier 200 may, in some embodiments, implement the sense amplifier SAMP of FIG. 1. The sense amplifier 200 may be a threshold-voltage compensating (VTC) sense amplifier with p-type transistors 202 and 204 coupled in a diode fashion and n-type transistors 206 and 208 cross-coupled with independent current control as described in more detail herein.

The amplifier 200 is coupled to a first digit line Da 210 and a second digit line Db 214 through column select transistors (not shown). The column select transistors act as switches which couple the digit lines to local input/output (LIO) lines when a column select signal CS provided by a column decoder (e.g., 110 of FIG. 1) is active. The digit lines Da 210 and Db 214 couple to memory cells at the intersection of word lines (not shown in FIG. 2). Based on which word line is active (e.g., based on signals from a row decoder such as 108 of FIG. 1) the memory cell may be coupled to the digit line. In some embodiments, during an example access operation, one digit line may intersect with an active memory cell along an active word line, while the other digit line is used as a reference. For the sake of explanation, the digit line Da 210 will discussed as the digit line coupled to a memory cell, while the digit line Db 214 will be discussed as a reference, however this may be different in other access operations.

The amplifier 200 is coupled between two system voltages which represent a logical high and a logical low voltage respectively. A signal line which carries the activation signal ACT may be charged to a first system voltage which represents a logical high when the signal ACT is active. A ground voltage such as VSS represents a low logical level. Various control signals BLCP, ISO, EQ, and NSA1 (which may be provided by the column decoder) may be used to control the operation of the amplifier 200 as described herein.

The amplifier 200 includes a pair of p-type transistors 202 and 204. The first p-type transistor 202 has a source coupled to ACT, a drain coupled to a first gut node Gut_a 212, and a gate coupled to the second digit line Db 214. The second p-type transistor 204 has a source coupled to ACT, a drain coupled to a second gut node Gut_b 216, and a gate coupled to the first digit line Da 210. Accordingly, when a voltage on Da is low, the transistor 204 may couple ACT to the node Gut_b 216 and when the voltage on Db is low, the transistor 202 may couple ACT to the node Gut_a 212. The two transistors 202 and 204 have sources coupled in common to ACT.

The gut nodes Gut_a 212 and Gut_b 216 may be shorted to the digit lines Db 214 and Da 210 through transistors 222 and 224 respectively when a bit line clamp signal BLCP is active. The transistor 222 has a drain coupled to Gut_a (e.g., to the drain of transistor 202) a source coupled to Db, and a gate coupled to BLCP. The transistor 224 has a drain coupled to Gut_b (e.g., to the drain of transistor 204), a source coupled to Da, and a gate couple to BLCP. The transistors 222 and 224 (e.g., BLCP transistors 222 and 224) may be n-type transistors. Accordingly, when the signal BLCP is active (e.g., at a high voltage), the transistors 222 and 224 may be active, and the transistor 222 may couple Gut_a to Db and the transistor 224 may couple Gut_b to Da. In other words, when the signal BLCP is active, the transistor 222 is active which shorts the drain and gate of the transistor 202, which will cause the transistor 202 to operate as a diode. Similarly, when the signal BLCP is active, the transistor 224 is active which shorts the drain and gate of transistor 204, which will cause the transistor 204 to operate as a diode. In this way, the two p-type transistors 202 and 204 are coupled in diode fashion, and may operate as diodes when the signal BLCP is active.

The amplifier 200 includes transistors 226 and 228 which short the digit lines Da and Db to their respective gut nodes Gut_a 212 and Gut_b 216 when an isolation signal ISO is active. The transistor 226 has a source coupled to Gut_a 212, a drain coupled to the digit line Da 210, and a gate coupled to the isolation signal ISO. The transistor 228 has a source coupled to Gut_b, 216, a drain coupled to the digit line Db 214 and a gate coupled to the signal ISO. The transistors 226 and 228 (e.g., isolation transistors) may be n-type transistors in some embodiments. Accordingly, when the signal ISO is active (e.g., at a high logical level), the transistors may be active and may couple the digit line Da 210 to the gut node Gut_a 212 through transistor 226 and may couple the digit line Db 214 to the gut node Gut_b 216 through transistor 228. When the signal ISO is at a low level, the transistors 226 and 228 may be inactive and the digit lines and gut nodes may be decoupled.

The amplifier 200 includes equalization transistors 230 and 232 which may charge the gut nodes to a voltage VBLP when an equalization signal EQ is active. The transistor 230 has nodes coupled to the two gut nodes Gut_a 212 and Gut_b 216 and a gate coupled to the signal EQ. The transistor 232 has nodes coupled to VBLP and the gut node Gut_a 212 and a gate coupled to the signal EQ. The transistors 230 and 232 may be n-type transistors. Accordingly, when the signal EQ is active (e.g., at a high logical level), the voltage VBLP may be coupled to the gut nodes Gut_a 212 and Gut_b 216. The voltage VBLP may be a system voltage which may be between the voltages along ACT and VSS. For example, VBLP may have a voltage which is about halfway between ACT and VSS. While in the example embodiment of FIG. 2, the transistor 232 couples VBLP to Gut_a 212, in some embodiments, the transistor 232 may couple VBLP to Gut_b 216 instead.

The amplifier 200 also includes a pair of n-type transistors 206 and 208 which are cross-coupled. The first n-type transistor 206 has a drain coupled to a Gut_a 212, a gate coupled to Gut_b 216, and a source coupled (through transistor 234 as explained more herein) to VSS. The second n-type transistor 208 has a drain coupled to Gut_b 216, a gate coupled to Gut_a 212, and a source coupled (through transistor 236 as explained more herein) to VSS. The transistor 234 has a source coupled to VSS, a drain coupled to a source of the transistor 206, and a gate coupled to a signal NSA1. Similarly, the transistor 236 has a source coupled to VSS, a drain coupled to a source of the transistor 208, and a gate coupled to NSA1. The transistors 234 and 236 (e.g., feedback transistors) may both be n-type transistors in some embodiments. Accordingly, when a feedback control signal NSA1 is active, the two transistors 234 and 236 may both be active, coupling the sources of transistors 206 and 208 to VSS. The transistors 234 and 236 may act as resistors when active. Accordingly, there may be independent current flow through each transistor 206 and 208. In other words, the current through transistor 206 may be different than the current through the transistor 208.

Figure 3:
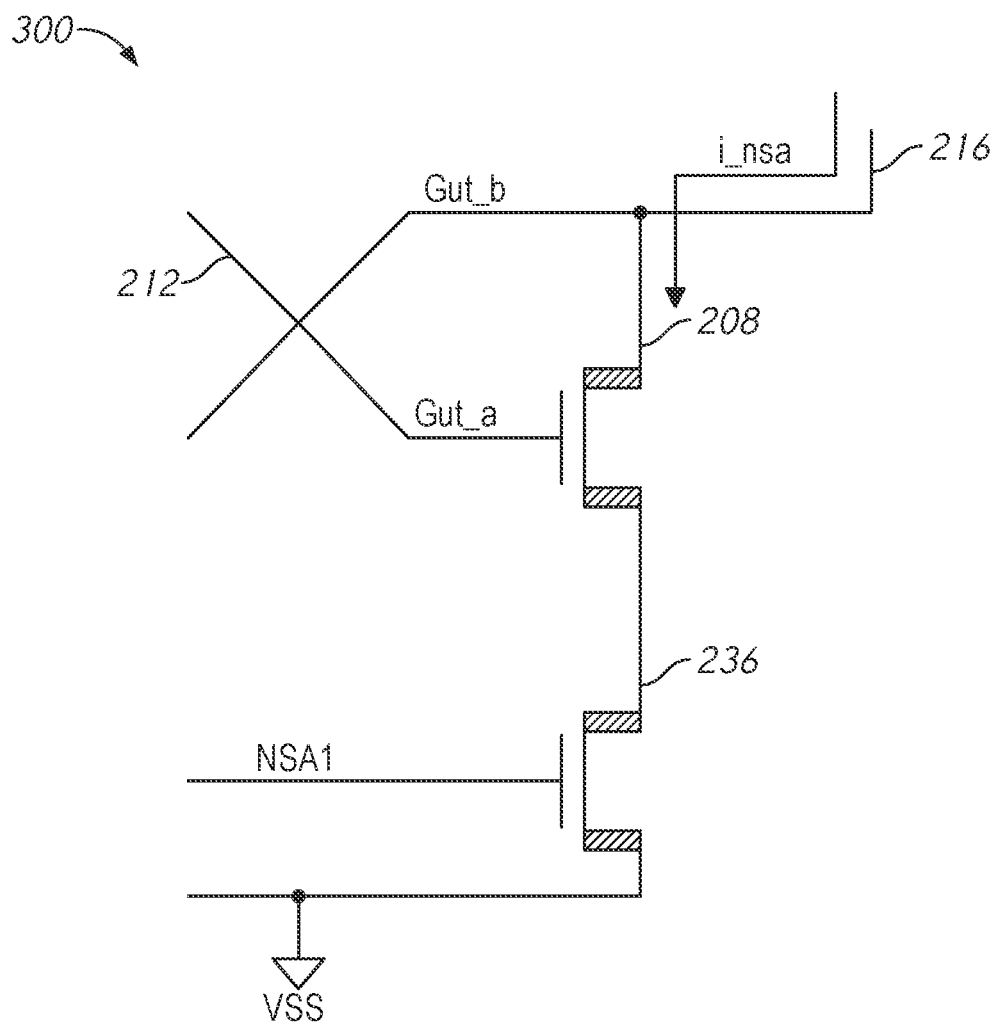
FIG. 3 shows a portion of the amplifier of FIG. 2 according to some embodiments of the present disclosure.

The box 300 shows a portion of the amplifier 200 which includes one of the two n-type transistors 208. FIG. 3 shows the box 300 in more detail.

FIG. 3 shows a portion of the amplifier of FIG. 2 according to some embodiments of the present disclosure. FIG. 3 shows the box 300 of FIG. 2 in more detail. The portion 300 details a current i_nsa flowing through the n-type transistor 208. The current i_nsa flows from the gut node Gut_b 216 through the transistors 208 and 236. The gate of transistor 208 is coupled to the gut node Gut_a 212, and the voltage on Gut_a 212 may be in a negative feedback relationship with the current i_nsa.

For example, as a voltage on Gut_a 212 increases (e.g., because the voltage on Db is decreasing), the current i_nsa may increase through the transistor 208. This in turn, may generate a higher power drop across the transistor 236, which may act as a resistor when the signals NSA1 is applied to its gate. The higher power drop across the transistor 236 may in turn lower the voltage from the gate to the source Vgs of the transistor 208. The reduced Vgs of the transistor 208 may decrease the current i_nsa flowing through that transistor 208. In this manner, the voltage on Gut_a 212 and the current i_nsa through transistor 208 may have an inverse relationship.

While transistor 206 is not shown in FIG. 3, a current (e.g., i_nsa2) may flow through that transistor in a similar manner, although the relationship of Gut_b 216 and Gut_a 212 may be reversed for the transistor 206. In other words, for the transistor 206, the voltage Gut_b may have an inverse relationship with i_nsa2 through the transistor 206. The two currents may be different from each other.

Returning to FIG. 2, the separate currents which flow through transistors 206 and 208 (and 234 and 236 respectively) may help balance a mismatch between the transistors 206 and 208. Since real transistors will generally have a mismatch between their threshold voltages allowing for separate current flow between the n-type transistors 206 and 208 may help balance any mismatch between the transistors 206 and 208 as the negative feedback of their currents may help them balance. The feedback control signal NSA1 may have a voltage which is selected to control the negative feedback.

The use of n-type transistors 206 and 208 in a cross-couple arrangement may be advantageous because n-type transistors may generally be stronger than p-type transistors. Accordingly, the amplifier 200 may have a much higher gain from the transistors 206 and 208 than a conventional amplifier where p-type transistors are cross-coupled. While the higher gain from using n-type transistors 206 and 208 may lead to increase problems due to Vt mismatch, this may be mitigated by the independent current (e.g., due to separate transistors 234 and 236) through the n-type transistors 206 and 208. The negative feedback relationship of the gut node voltages to the current through the transistors 206 and 208 may lead to an increased linear gain region for the n-type transistors 206 and 208. The arrangement of the sense amplifier 200 may increase the accuracy with which signals along the digit lines Da and Db are sensed. The arrangement of the sense amplifier 200 may also increase a speed of a compensation operation (e.g., may decrease a time between t0 and t1 of FIG. 4 as described in more detail below).

For the sake of clarity and ease of explanation, various transistors may be given names based on the signals which operate them. For example, the transistors 222 and 224 coupled to the bit line clamp (BLCP) signal may be referred to as a first BLCP transistor 222 and a second BLCP transistor 224. Similarly transistors 226 and 228 may be a first and second isolation transistor, transistors 230 and 232 may be first and second equalization transistors, and transistors 234 and 236 may be first and second feedback transistors. However, it should be understood that these names are merely intended to aid in understanding which transistor is which. The use of such labels is not intended to indicate that the transistors are of different types from each other (except as noted).

Figure 4:
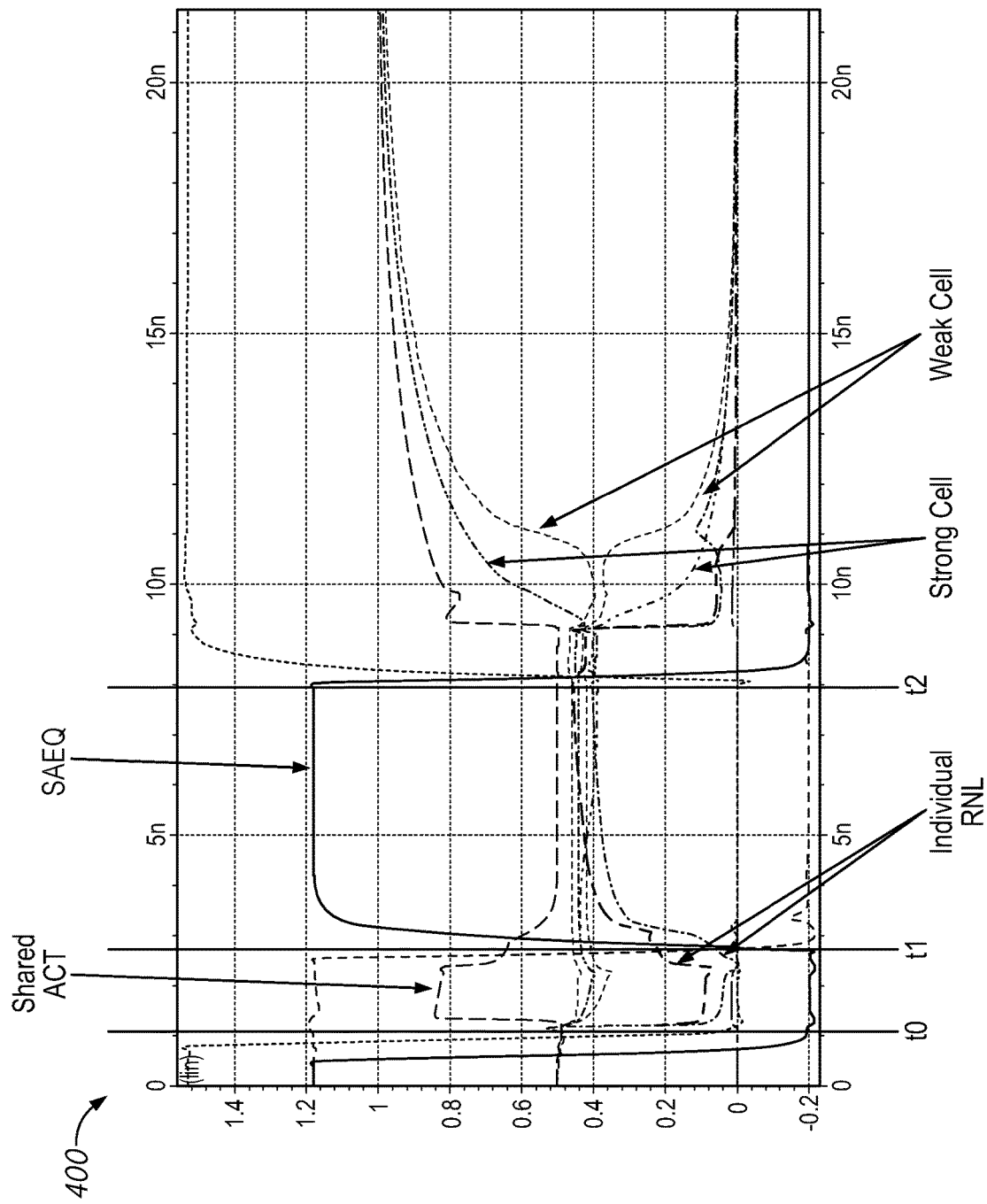
FIG. 4 is a chart of an example operation of a sense amplifier according to some embodiments of the present disclosure.

FIG. 4 is a chart of an example operation of a sense amplifier according to some embodiments of the present disclosure. The chart 400 may, in some embodiments, represent an operation of a sense amplifier 200 of FIG. 2. The chart 400 includes time along a horizontal axis and voltage along a vertical axis. While certain values and scales of time and voltage are shown in FIG. 4, it should be understood that these are example values only.

Before an initial time t0, the signals ISO and EQ are both active. Accordingly, transistors 226, 228, 230, and 232 may all be active, which may couple a voltage VBLP to the gut nodes Gut_a and Gut_b and also to the digit lines Da and Db. The signal BLCP may also be active which may keep the p-type transistors 202 and 204 in a diode configuration coupled as diodes between ACT and the gut nodes Gut_a and Gut_b.

At the initial time t0, the signals EQ and ISO both become inactive, while the signal BLCP remains active. The since the two p-type transistors 202 and 204 are coupled in diode fashion (e.g., because BLCP is still active) and since they are coupled in common to the signal line ACT, there may be a common voltage across both p-type transistors (labelled here as "Shared ACT"). However, the two n-type transistors 206 and 208 have different voltages across them (labelled here as "Individual RNL") due to being coupled to VSS through separate transistors 234 and 236.

At a time t1, the signal BLCP is deactivated (which stops the p-type transistors from being coupled diode fashion) and the signal EQ becomes active again. The signal EQ becoming active couples the gut nodes Gut_a and Gut_b back to a voltage VBLP. Accordingly, the voltage across the p-type transistors begins falling, while the voltage across the n-type transistors begins rising. Note that the voltages across the two n-type transistors may remain different from each other.

At a time t2, the signal EQ becomes inactive, while the signal ISO becomes active again. The signal EQ becoming inactive decouples the gut nodes from the voltage VBLP, while the signal ISO becoming active couples the digit lines to the gut nodes. After the time t2, the voltages on the digit lines change based on the voltage from a memory cell coupled to the digit lines. Two examples are shown for a memory cells with a relatively strong signal and a memory cell with relatively weak signal. At some point after t2, the values of one or both digit lines may be latched to capture the sensed signal.

Figure 5:
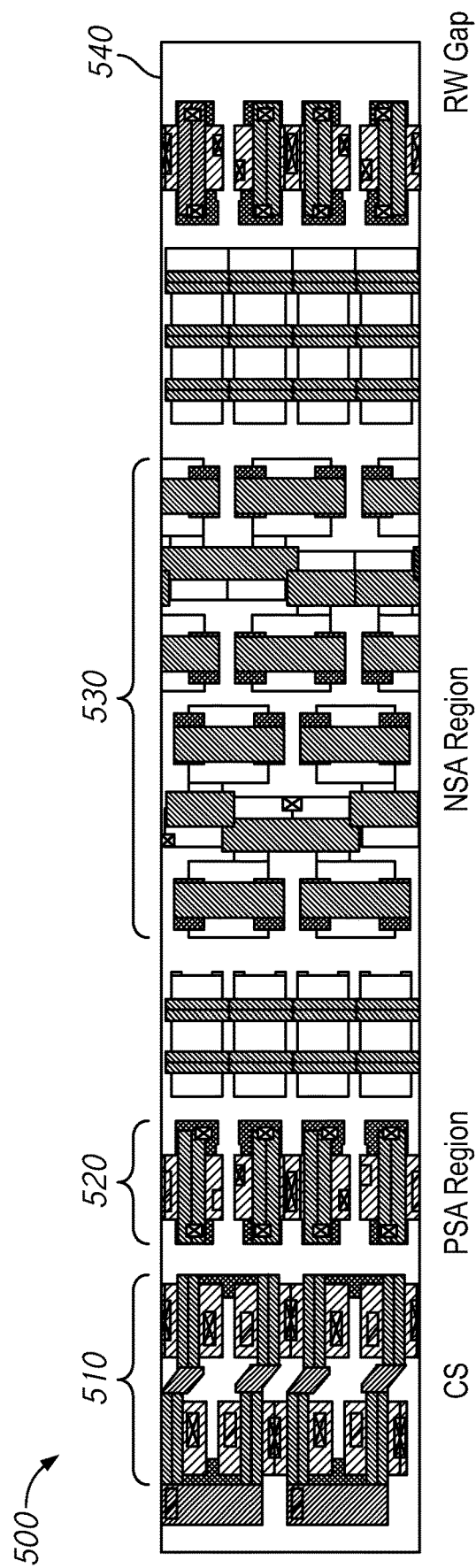
FIG. 5 is a layout diagram of a sense amplifier region according to some embodiments of the present disclosure.

FIG. 5 is a layout diagram of a sense amplifier region according to some embodiments of the present disclosure. The layout 500 shows an example layout of a portion of a memory chip which includes sense amplifiers. The layout 500 may show an example layout of the sense amplifier 200 of FIG. 2 in some embodiments.

The layout diagram includes several sections showing how various transistors used to implement the sense amplifier may be laid out. For example, the layout diagram 500 includes a column select CS transistor region 510, a PSA region 520, an NSA region 530, and a read/write (RW) gap 540.

The CS region 510 includes column select transistors used to couple bit lines (e.g., Da and/or Db) to the sense amplifier in response to a column select signal from a column decoder (e.g., 110 of FIG. 1). The PSA region 520 includes the pair of p-type transistors in the sense amplifier (e.g., 202 and 204 of FIG. 2). The NSA region 530 includes the n-type transistors (e.g., 206 and 208 of FIG. 2) along with the feedback transistors (e.g., 234 and 236 of FIG. 2). The RW gap may separate the sense amplifier from a matching sense amplifier extending away from the RW gap (not shown).

In the NSA region 530, the transistors may be divided up and may not share common connections (the way that the transistors in the PSA region 520 do). This allows for the n-type transistors to have separate current flows and separate voltage drops from each other.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
   a first digit line;
   a second digit line;
   a first gut node;
   a second gut node;
   a first transistor configured to couple a first voltage to the first gut node based on a voltage on the second digit line;
   a second transistor configured to couple the first voltage to the second gut node based on a voltage on the first digit line, wherein the first and the second transistors are p-type transistors and wherein the first and the second transistors are configured to be coupled in a diode fashion when a command signal is active;
   a third transistor configured to couple the first gut node to a second voltage based on a voltage on the second gut node;
   a fourth transistor configured to couple the second gut node to the second voltage based on a voltage on the first gut node, wherein the third and the fourth transistors are n-type;
   a first bit line clamp (BLCP) transistor configured to short the first gut node to the second digit line when the command signal is active; and
   a second BLCP transistor configured to short the second gut node to the first digit line when the command signal is active.

2. The apparatus of claim 1, further comprising:
   a fifth transistor coupled between the third transistor and a signal line carrying the second voltage; and
   a sixth transistor coupled between the fourth transistor and a signal line carrying the second voltage.

3. The apparatus of claim 2, wherein a gate of the fifth transistor and a gate of the sixth transistor are coupled in common to a feedback control signal.

4. The apparatus of claim 1, wherein a first current flows through the third transistor and a second current different than the first current flows through the fourth transistor.

5. The apparatus of claim 1, wherein:
   the first BLCP transistor is further configured to couple a drain of the first transistor to a gate of the first transistor when the command signal is active; and
   the second BLCP transistor is further configured to couple a drain of the second transistor to a gate of the second transistor when the command signal is active.

6. The apparatus of claim 1, further comprising:
   a first isolation transistor configured to couple the first digit line to the first gut node when an isolation signal is active; and
   a second isolation transistor configured to couple the second digit line to the second gut node when the isolation signal is active.

7. The apparatus of claim 1, further comprising:
   a first equalization transistor configured to couple the first gut node to the second gut node when an equalization signal is active; and
   a second equalization transistor configured to couple the first gut node to a third voltage when the equalization signal is active.

8. The apparatus of claim 1, wherein at least one of the first digit line and the second digit line is coupled to a memory cell at an intersection with an active word line.

9. An apparatus comprising:
a first gut node;
a second gut node;
a first digit line;
a second digit line;
a pair of p-type transistors with gates coupled to the second and the first digit lines respectively, the pair of p-type transistors configured to be coupled in a diode configuration between a first voltage and the first and the second gut node respectively when a control signal is active;
a pair of n-type transistors cross-coupled between the first and the second gut nodes respectively;
a first feedback transistor configured to couple one of the cross-coupled pair of n-type transistors to a ground voltage;
a second feedback transistor configured to couple another of the cross-coupled pair of n-type transistors to the ground voltage;
a first bit-line clamp (BLCP) transistor configured to short the first gut node to the second digit line when the control signal is active; and
a second BLCP transistor configured to short the second gut node to the first digit line when the control signal is active.

10. The apparatus of claim 9, wherein a voltage across a first of the pair of n-type transistors is different than a voltage across a second of the pair of n-type transistors.

11. The apparatus of claim 9, wherein a first of the pair of p-type transistors has a source coupled to the first voltage, a drain coupled to the first gut node and a gate coupled to the second digit line, and wherein a second of the pair of p-type transistors has a source coupled to the first voltage, a drain coupled to the second gut node and a gate coupled to the first digit line.

12. The apparatus of claim 11, wherein:
the first BLCP transistor is further configured to short the drain and the gate of the first of the pair of p-type transistors when the control signal is active; and
the second BLCP transistor is further configured to short the drain the gate of the second of the pair of p-type transistors when the control signal is active.

13. The apparatus of claim 9, wherein a first of the pair of n-type transistors has a drain coupled to the first gut node and a gate coupled to the second gut node, and wherein a second of the pair of n-type transistors has a drain coupled to the second gut node and a gate coupled to the first gut node.

14. The apparatus of claim 13, wherein a gate of the first feedback transistor and a gate of the second feedback transistor are coupled to a feedback control signal.

15. The apparatus of claim 9, further comprising a pair of isolation transistors configured to couple the first digit line to the first gut node and the second digit line to the second gut node when an isolation signal is active.

16. The apparatus of claim 9, further comprising a pair of equalization transistors configured to couple a second voltage to the first gut node and the second gut node when an equalization signal is active.

17. An apparatus comprising:
a first digit line;
a second digit line;
a first gut node;
a second gut node;
a first p-type transistor with nodes coupled to a system voltage and the first gut node and a gate coupled to the second digit line;
a second p-type transistor with nodes coupled to the system voltage and the second gut node and a gate coupled to the first digit line;
a first bit line clamp (BLCP) transistor configured to short the first gut node and the second digit line when a BLCP signal is active;
a second BLCP transistor configured to short the second gut node to the first digit line when the BLCP signal is active;
a first n-type transistor with a node coupled to the first gut node and a gate coupled to the second gut node; and
a second n-type transistor with a node coupled to the second gut node and a gate coupled to the first gut node.

18. The apparatus of claim 17, further comprising:
a first feedback transistor coupled between a second node of the first n-type transistor and a ground voltage; and
a second feedback transistor coupled between a second node of the second n-type transistor and ground voltage.

19. The apparatus of claim 18, wherein a gate of the first feedback transistor and a gate of the second feedback transistor are coupled in common to a feedback control signal.

20. The apparatus of claim 17, further comprising:
a first isolation transistor coupled between the first digit line and the first gut node with a gate coupled to an isolation signal; and
a second isolation transistor coupled between the second digit line and the second gut node with a gate coupled to the isolation signal.

21. The apparatus of claim 17, further comprising:
a first equalization transistor coupled between a second system voltage and one of the first gut node or the second gut node with a gate coupled to an equalization signal; and
a second equalization transistor coupled between the first gut node and the second gut node with a gate coupled to the equalization signal.

* * * * *